United States Patent
Kim et al.

(10) Patent No.: US 8,394,705 B2
(45) Date of Patent: Mar. 12, 2013

(54) METHOD OF MANUFACTURING SEMICONDUCTOR DEVICE HAVING OPTICAL DEVICES

(75) Inventors: In Gyoo Kim, Daejeon (KR); Dae Seo Park, Incheon (KR); Jun Taek Hong, Seoul (KR); Gyungock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 159 days.

(21) Appl. No.: 12/783,216

(22) Filed: May 19, 2010

(65) Prior Publication Data

US 2011/0136318 A1    Jun. 9, 2011

(30) Foreign Application Priority Data

Dec. 9, 2009  (KR) .................. 10-2009-0121654

(51) Int. Cl.
*H01L 21/76*    (2006.01)
(52) U.S. Cl. .......... 438/425; 438/31; 438/424; 438/426; 438/427; 257/509; 257/647
(58) Field of Classification Search .................... 438/31, 438/424–427; 257/509, 647
See application file for complete search history.

(56) References Cited

U.S. PATENT DOCUMENTS

| | | | | |
|---|---|---|---|---|
| 5,252,514 A | * | 10/1993 | Schuppert | 438/31 |
| 5,838,870 A | * | 11/1998 | Soref | 385/131 |
| 5,987,196 A | * | 11/1999 | Noble | 385/14 |
| 6,316,281 B1 | * | 11/2001 | Lee et al. | 438/31 |
| 6,615,614 B1 | | 9/2003 | Makikawa et al. | |
| 6,993,225 B2 | * | 1/2006 | Patel et al. | 385/43 |
| 7,030,455 B2 | * | 4/2006 | Gamand et al. | 257/508 |
| 7,915,700 B2 | * | 3/2011 | Suh et al. | 257/432 |
| 8,017,420 B2 | * | 9/2011 | Kim et al. | 438/31 |
| 8,260,098 B1 | * | 9/2012 | Golubovic et al. | 385/14 |
| 8,288,185 B2 | * | 10/2012 | Kim et al. | 438/31 |

(Continued)

FOREIGN PATENT DOCUMENTS

| | | |
|---|---|---|
| JP | 05-164932 A | 6/1993 |
| JP | 05-224055 A | 9/1993 |

(Continued)

OTHER PUBLICATIONS

Nicolas Sherwood-Droz et al., "CMOS-Compatible Waveguiding Platform on Bulk Silicon," Proc. Group IV photonics, Sep. 9-11, 2009, pp. 143-145, IEEE.

(Continued)

*Primary Examiner* — Fernando L Toledo
*Assistant Examiner* — Mohammed Shamsuzzaman

(57) ABSTRACT

Provided is a method of manufacturing a semiconductor device. According to the method, a first buried oxide layer is formed in the semiconductor substrate in a first region, such that a first semiconductor layer is defined on the first buried oxide layer. An active portion is defined by forming a trench in the semiconductor substrate in a second region. A capping semiconductor pattern is formed on a top surface and an upper portion of a sidewall of the active portion. An oxide layer is formed by oxidizing the capping semiconductor pattern and an exposed lower portion of the sidewall of the active portion, such that the oxide layer surrounds a non-oxidized portion of the active portion. The non-oxidized portion of the active portion is a core and one end of the core is connected to a first optical device formed at the first semiconductor.

3 Claims, 16 Drawing Sheets

U.S. PATENT DOCUMENTS

| | | |
|---|---|---|
| 2003/0118310 A1 | 6/2003 | Steinberg et al. |
| 2004/0114869 A1* | 6/2004 | Fike et al. .................. 385/43 |
| 2006/0093967 A1* | 5/2006 | Block ......................... 430/321 |
| 2008/0285610 A1* | 11/2008 | Hall et al. ............... 372/45.011 |
| 2009/0065682 A1* | 3/2009 | Webster .................. 250/208.2 |
| 2009/0087137 A1* | 4/2009 | Doan .......................... 385/14 |
| 2010/0044828 A1* | 2/2010 | Suh et al. ................... 257/506 |
| 2010/0144075 A1* | 6/2010 | Kim et al. ................... 438/31 |
| 2010/0295083 A1* | 11/2010 | Celler ......................... 257/98 |
| 2011/0039388 A1* | 2/2011 | Hill et al. ................... 438/294 |
| 2011/0133306 A1* | 6/2011 | Kim et al. ................... 257/506 |
| 2011/0235962 A1* | 9/2011 | Shubin et al. ................. 385/14 |
| 2012/0002694 A1* | 1/2012 | Bowers et al. ............. 372/45.01 |
| 2012/0129302 A1* | 5/2012 | Assefa et al. ................ 438/154 |

FOREIGN PATENT DOCUMENTS

| | | |
|---|---|---|
| JP | 2001-021744 A | 1/2001 |
| KR | 1020010030200 A | 4/2001 |
| KR | 1020050043137 A | 5/2005 |

OTHER PUBLICATIONS

B. E. Deal et al., "General Relationship for the Thermal Oxidation of Silicon," Journal of Applied Physics, Dec. 1965, pp. 3770-3778, vol. 36, No. 12, AIP.

* cited by examiner

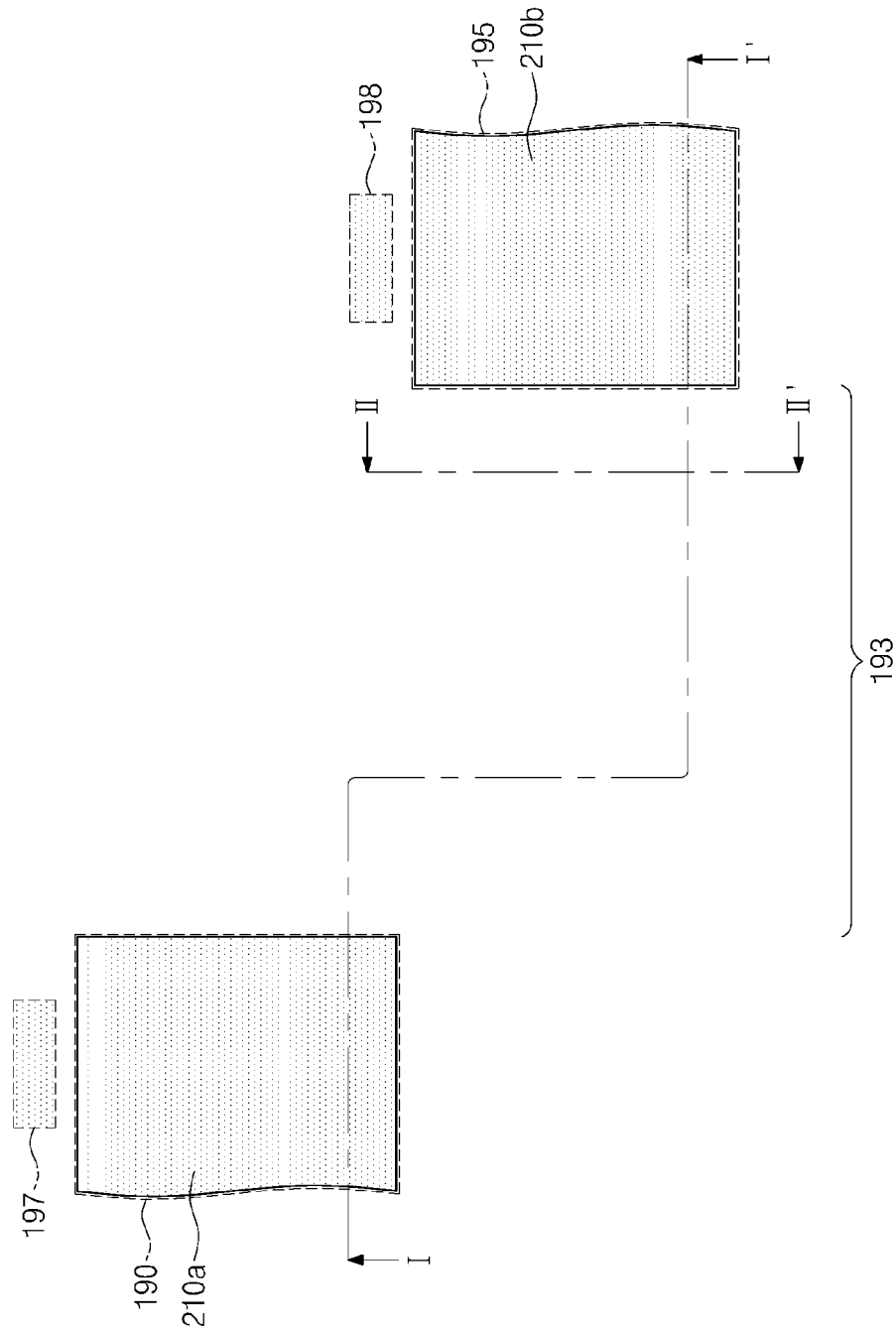

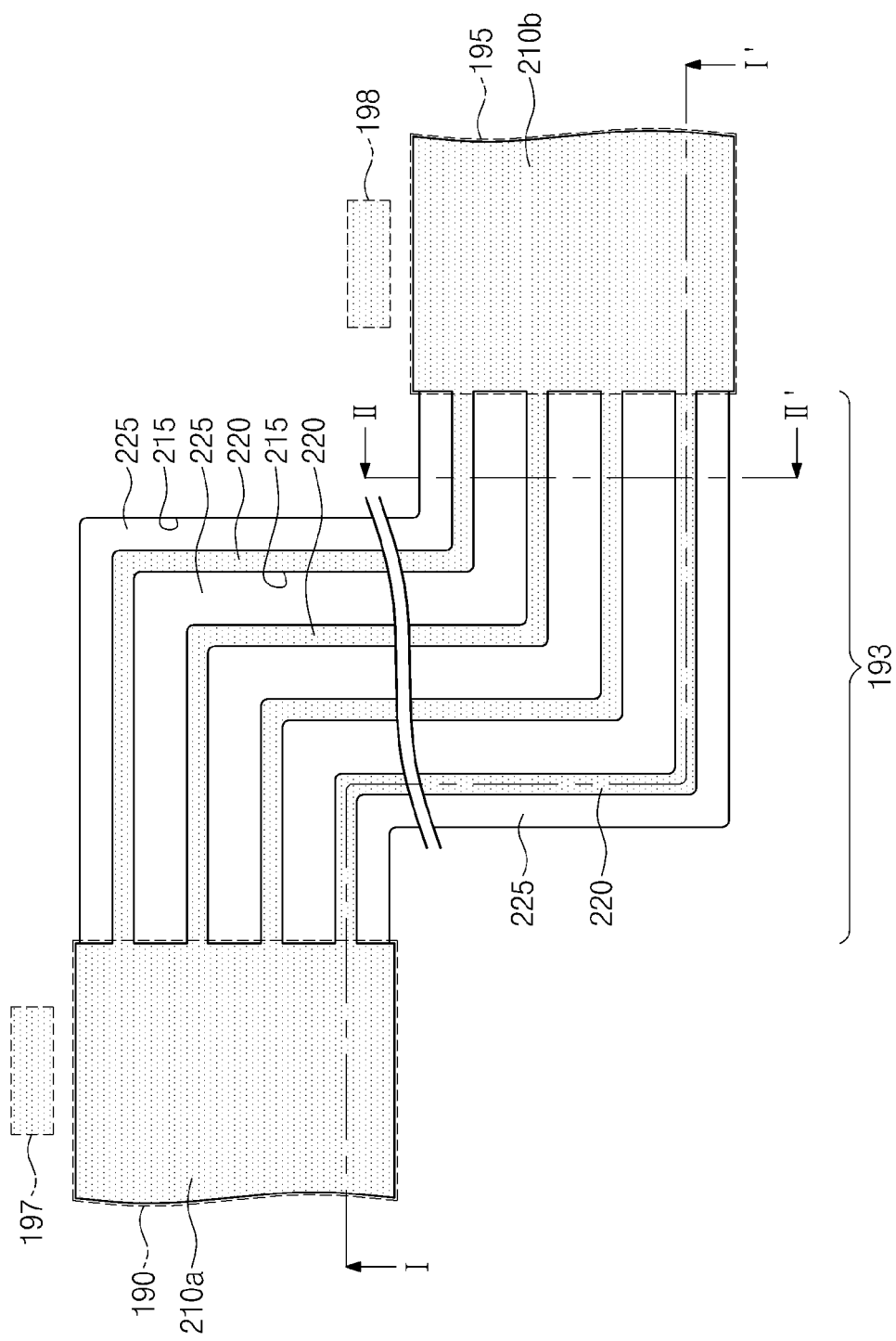

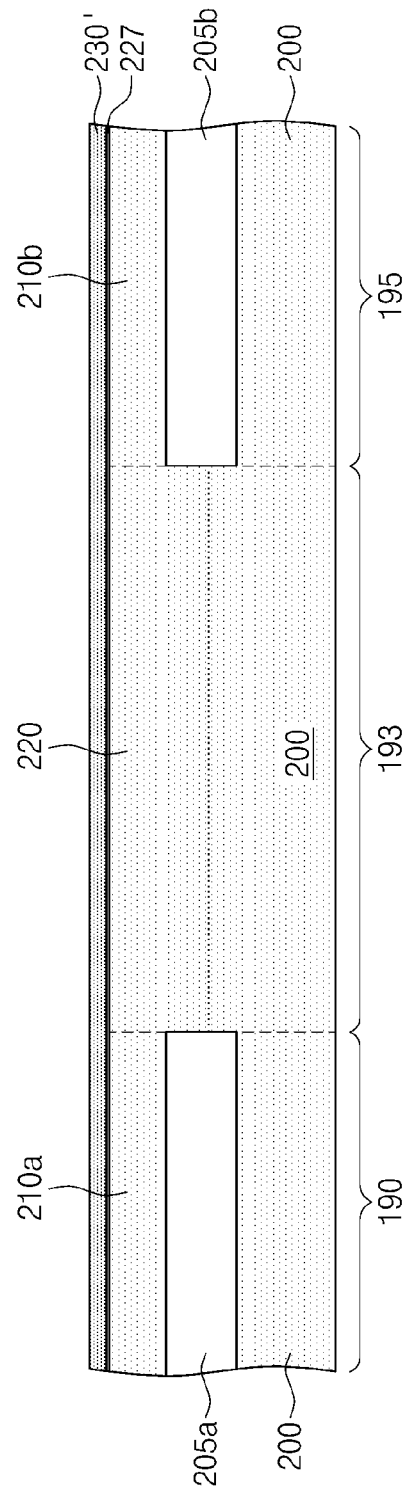
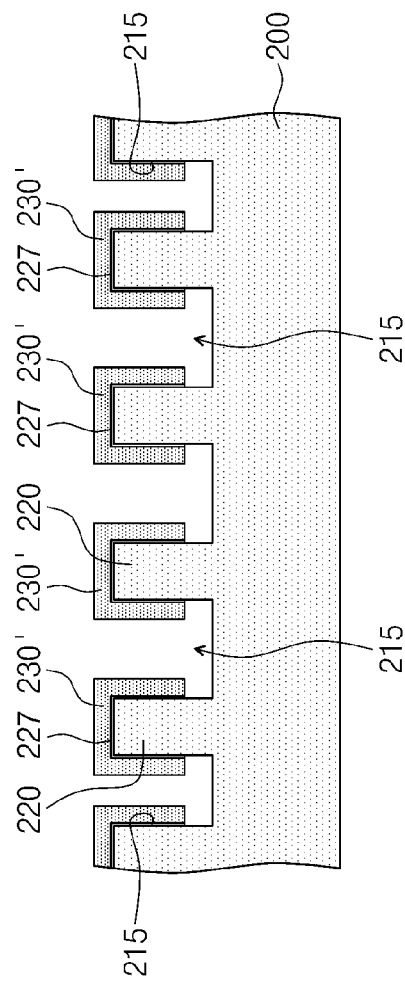

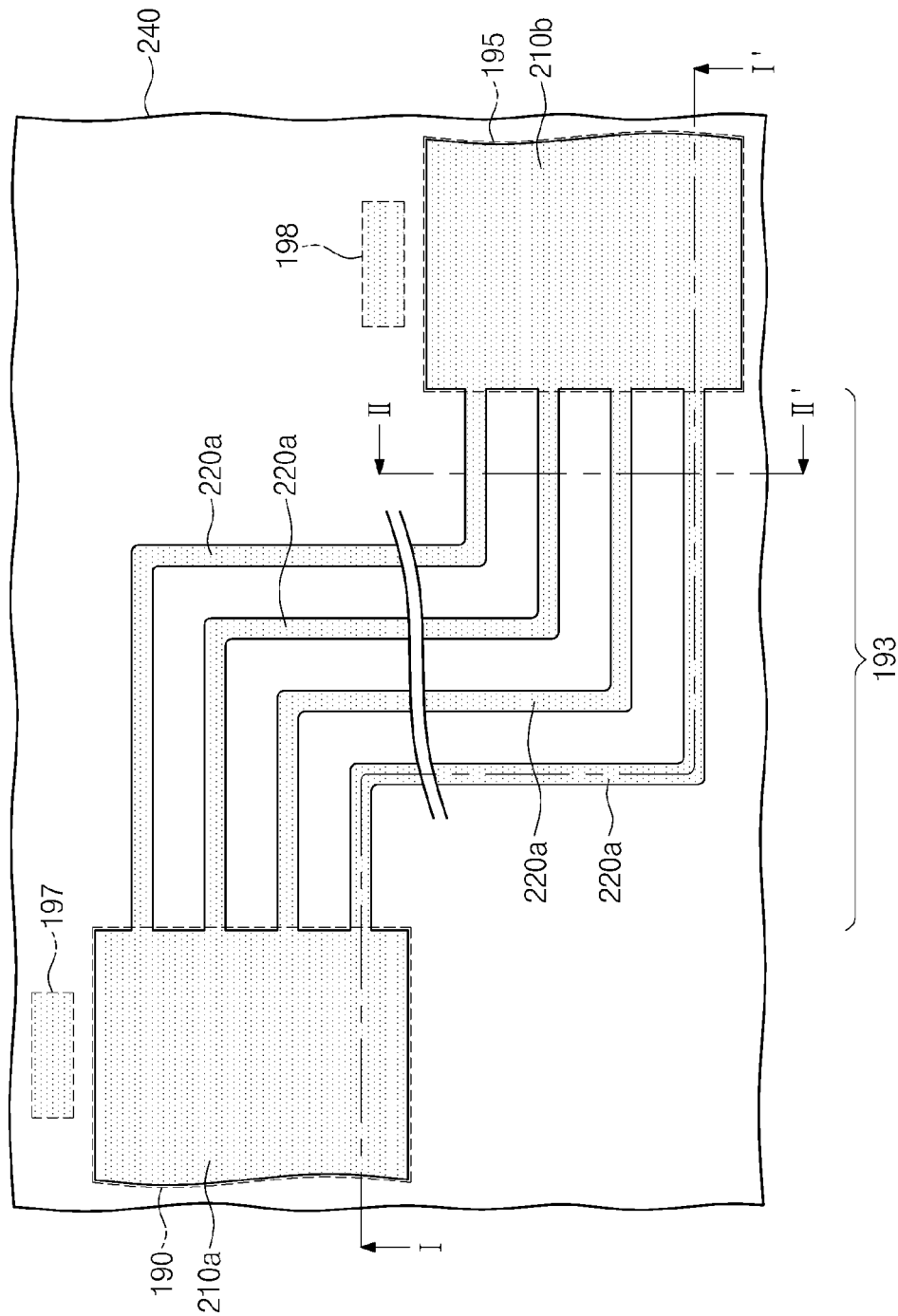

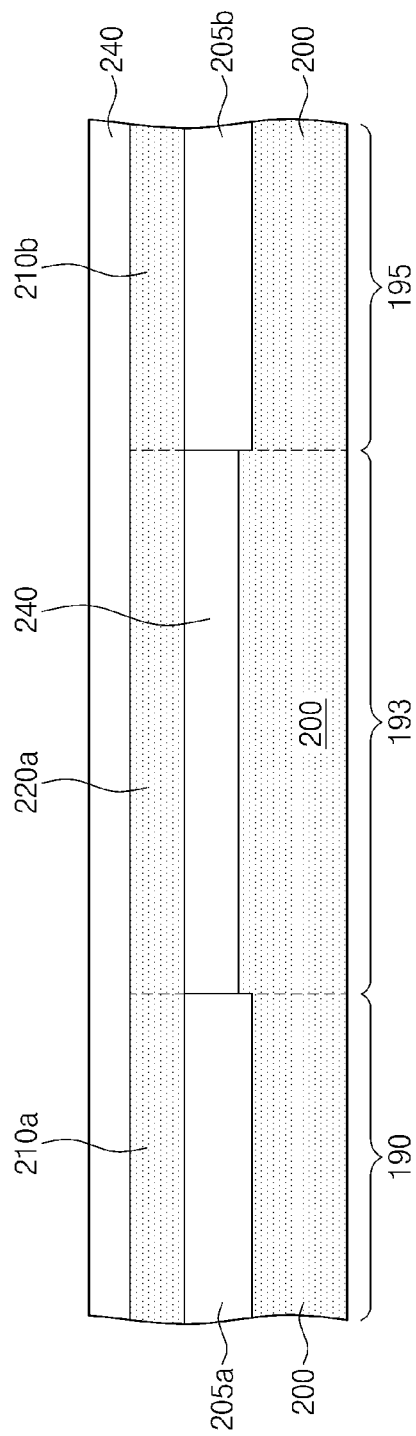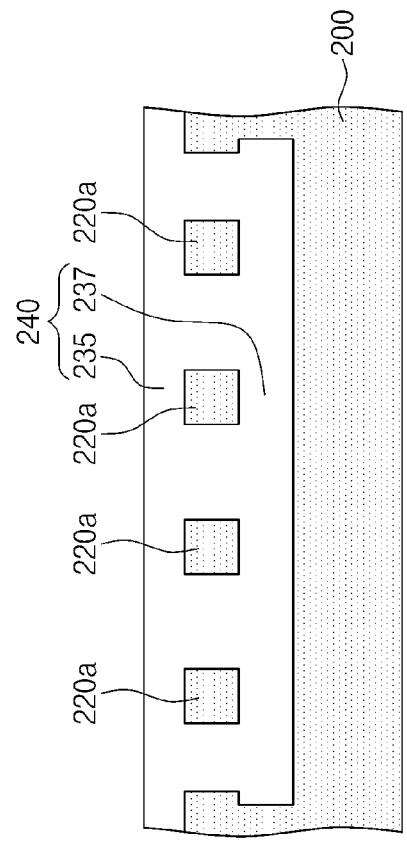

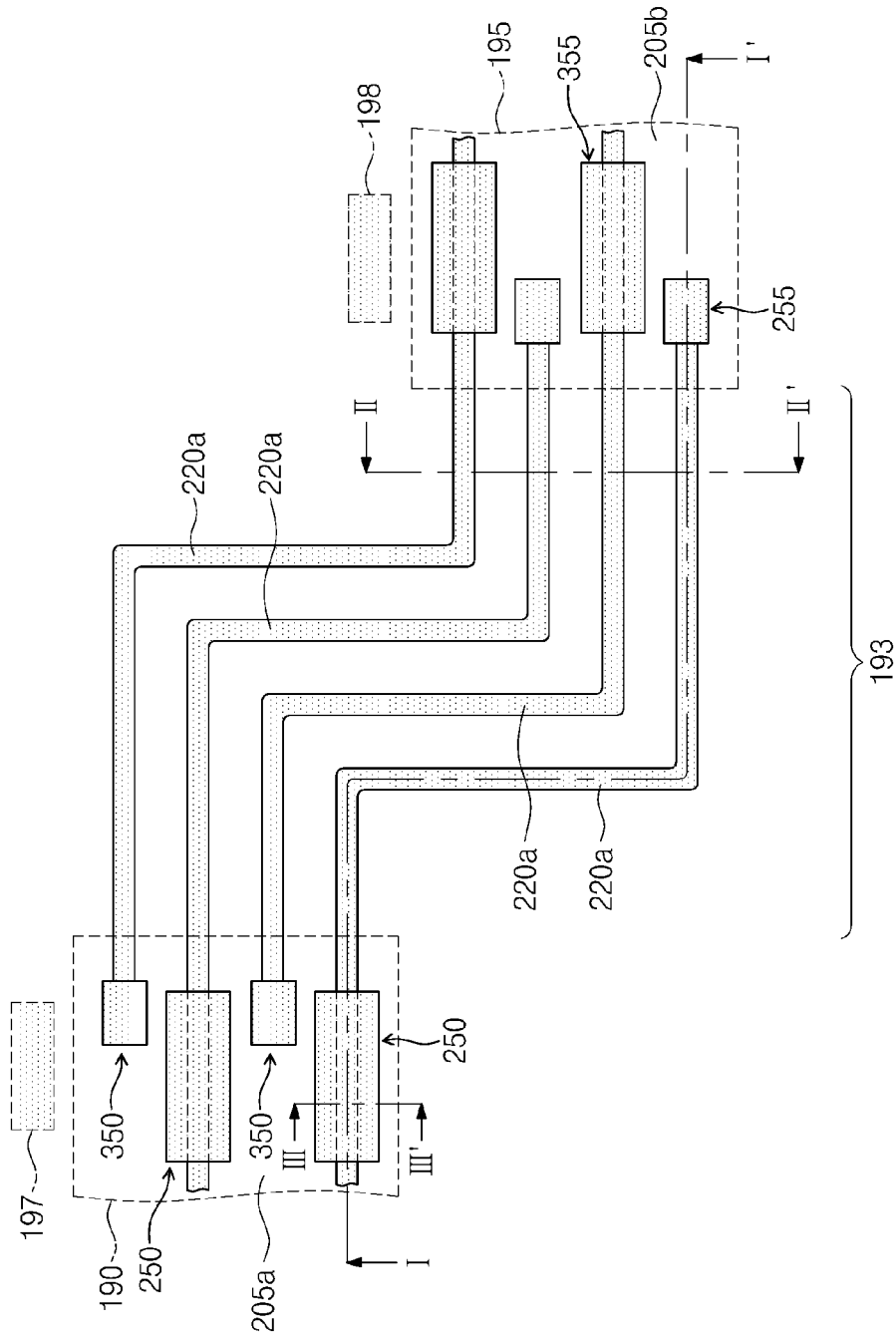

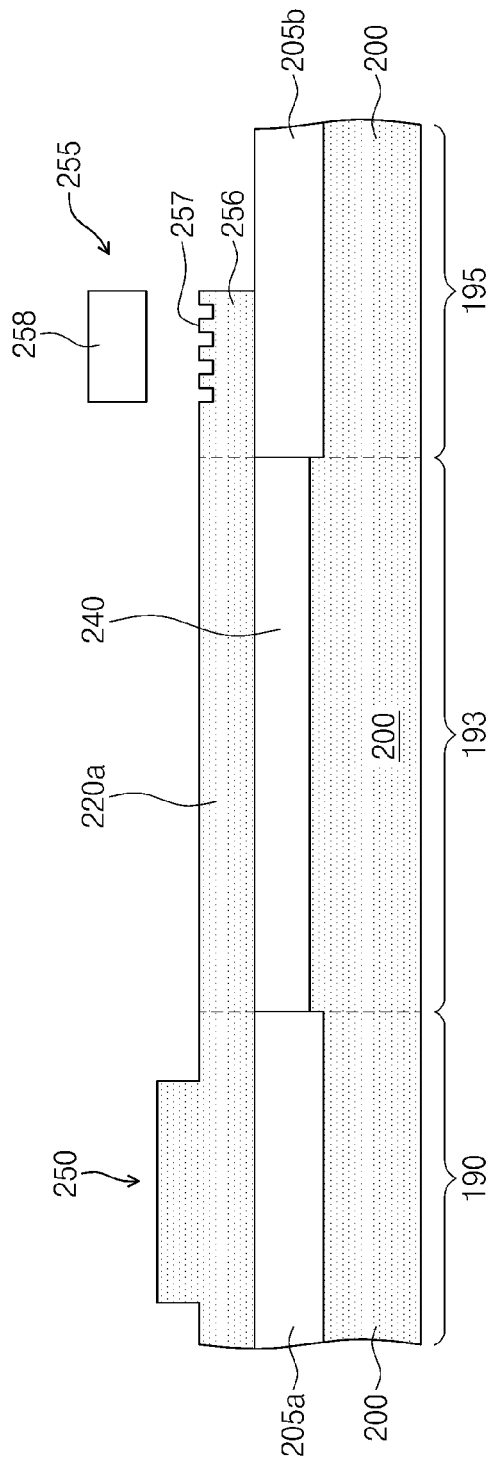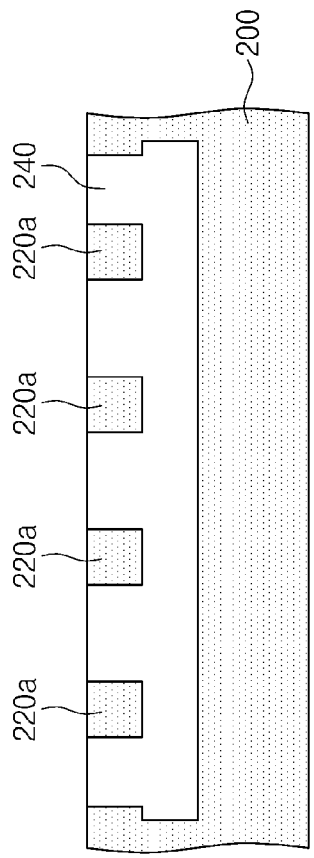

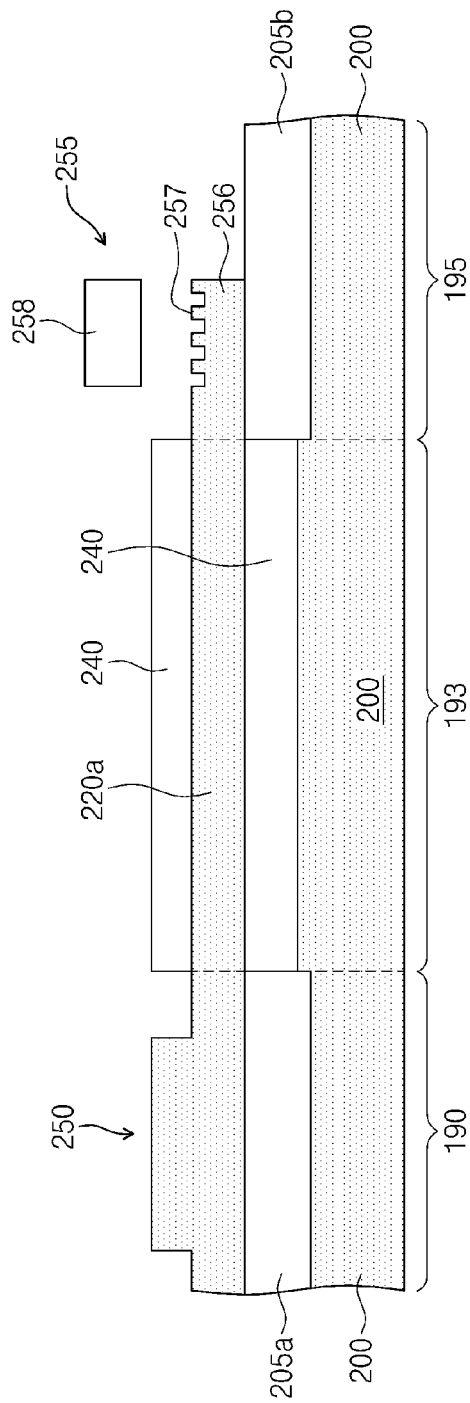
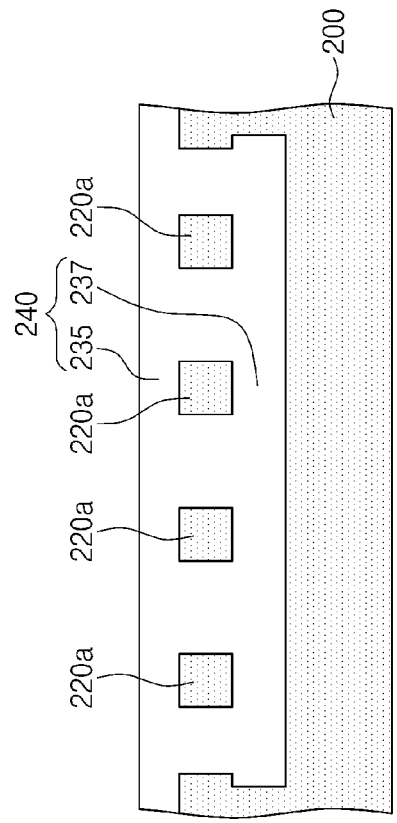

METHOD OF MANUFACTURING SEMICONDUCTOR DEVICE HAVING OPTICAL DEVICES

CROSS-REFERENCE TO RELATED APPLICATIONS

This U.S. non-provisional patent application claims priority under 35 U.S.C. §119 of Korean Patent Application No. 10-2009-0121654, Dec. 9, 2009, the entire contents of which are hereby incorporated by reference.

BACKGROUND OF THE INVENTION

The present invention disclosed herein relates to a method of manufacturing a semiconductor device, and more particularly, to a method of manufacturing a semiconductor device having optical devices.

As the semiconductor industry has been advanced, demands for lighter, more integrated, and faster semiconductor integrated circuits are getting intensified. However, it is getting more difficult to meet the demands due to a variety of factors. For example, there is a limitation in increasing a signal transmission speed between semiconductor integrated circuits or between internal devices of the semiconductor integrated circuit due to the heat generation caused by high integration and communication speed limitation caused by wires for electrical data communication.

To solve the limitation, researches on optical communication and/or optical interconnection have been making much progress lately. That is, many researches for replacing signals between the semiconductor integrated circuits, between the semiconductor integrated circuit and other electronic medium, and/or between the internal devices of the semiconductor integrated circuit with optical signals have been going on.

In the fields of the optical communication and/or optical interconnection, the optical signals may be transferred through an optical waveguide. There is a need for the optical waveguide to reduce an optical signal loss. Therefore, many researches for the optical waveguide that can reduce the optical signal loss and is proper for the semiconductor integrated circuit has been making process lately.

SUMMARY OF THE INVENTION

The present invention provides a method for manufacturing a semiconductor device including an optical waveguide having excellent reliability.

The present invention also provides a method for manufacturing a semiconductor device including an optical device having excellent reliability and an optical waveguide connected to the optical device and having excellent reliability.

Embodiments of the present invention provide methods of manufacturing a semiconductor device, the methods including: providing a semiconductor substrate having a first region and a second region; forming a first buried oxide layer in the semiconductor substrate in the first region, wherein a first semiconductor layer is defined on the first buried oxide layer in the first region; defining an active portion by forming a trench in the semiconductor substrate in the second region; forming a capping semiconductor pattern on a top surface of the active portion and an upper portion of a sidewall of the active portion and exposing a lower portion of the sidewall of the active portion; forming an oxide layer by oxidizing the capping semiconductor pattern and the lower portion of the sidewall of the active portion through an oxidizing process, wherein the oxide layer surrounds a non-oxidized portion of the active portion; and forming a first optical device at the semiconductor layer, wherein the non-oxidized portion of the active portion is a core through which optical signals passes and a first end of the core is connected to the first optical device.

In some embodiments, the capping semiconductor pattern may be fully oxidized by the oxidizing process.

In other embodiments, the forming of the capping semiconductor pattern may include: forming a sacrificing pattern filling the trench; exposing the upper portion of the sidewall of the active portion by recessing the sacrificing pattern; conformally forming the capping semiconductor layer on the substrate; removing the capping semiconductor layer on the recessed sacrificing pattern to expose the recessed sacrificing pattern and to form the capping semiconductor pattern; and removing the exposed sacrificing pattern to expose the lower portion of the sidewall of the active portion.

In still other embodiments, the capping semiconductor pattern may extend to cover a top surface of the first semiconductor layer and a portion of the capping semiconductor pattern on the first semiconductor layer may be oxidized by the oxidizing process, so that the oxide layer may be further formed on the first semiconductor layer.

In even other embodiments, the method may further include: before forming of the first optical device, removing the oxide layer on the first semiconductor layer. The removing of the oxide layer on the first semiconductor layer may include planarizing the oxide layer until the first semiconductor layer and a top surface of the core are exposed.

In yet other embodiments, the method may further include, before the forming of the capping semiconductor layer, forming a buffer layer on the exposed upper portion of the sidewall of the active portion and the top surface of the active portion. The buffer layer may be further formed on the first semiconductor layer.

In further embodiments, the semiconductor substrate may further include a third region spaced apart from the first and second regions. In this case, the method may further include: forming a second buried oxide layer in the semiconductor substrate in the third region, wherein a second semiconductor layer is defined on the second buried oxide layer in the third region; and forming a second optical device at the second semiconductor layer, wherein the second optical device is connected to a second end of the core.

In still further embodiments, the first and second optical devices may be formed after the core and the oxide layer by the oxidizing process are formed.

In even further embodiments, the first and second buried oxide layers may be simultaneously formed.

In even yet other embodiments, the first and second buried oxide layer may be formed through a separation by implanted oxygen (SIMOX) process.

In even further other embodiments, the capping semiconductor pattern may be formed of a same material as the semiconductor substrate.

In even yet further other embodiments, the capping semiconductor pattern may be in a polycrystal state and the semiconductor substrate may be in a single-crystal state.

In even yet further other embodiments, the semiconductor substrate may be a bulk silicon substrate, the capping semiconductor pattern may be formed of polysilicon, and the oxide layer by the oxidizing process may be a silicon oxide layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 1A through 7A are plan views illustrating a method of manufacturing a semiconductor device according to an embodiment;

FIGS. 1B through 7B are cross-sectional views that are respectively taken along lines I-I' of FIGS. 1A through 7A;

FIGS. 1C through 7C are cross-sectional views that are respectively taken along lines II-II' of FIGS. 1A through 7A;

FIGS. 9A and 9B are respectively views taken along lines I-I' and II-II' of FIG. 7A, illustrating modified examples of the method for manufacturing the semiconductor device.

DETAILED DESCRIPTION OF PREFERRED EMBODIMENTS

Figure 1B:
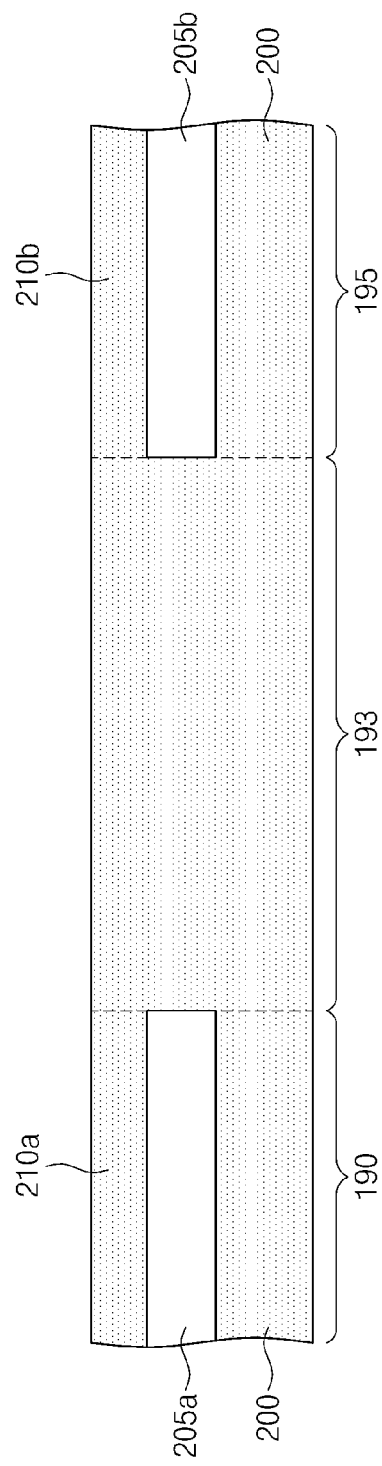

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, it will be described about an exemplary embodiment of the present invention in conjunction with the accompanying drawings.

Figure 8:
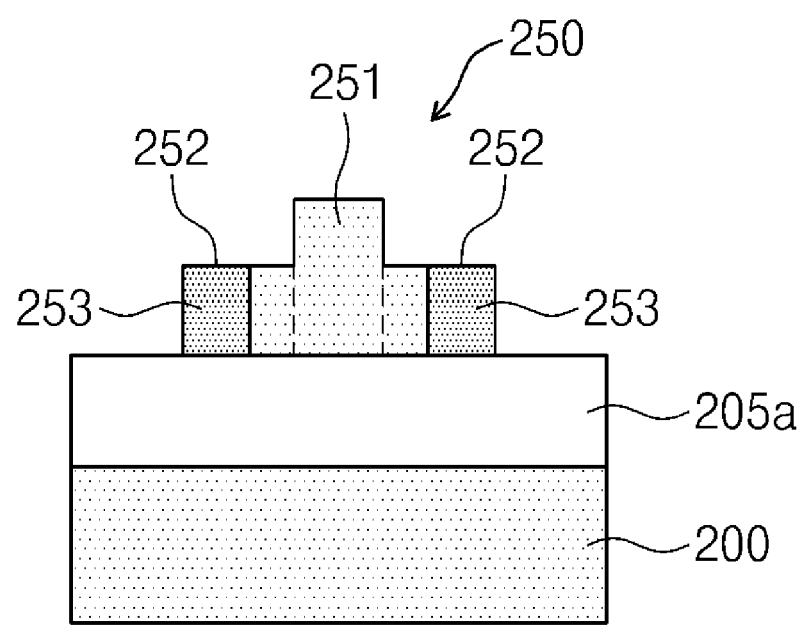
FIG. 8 is a cross-sectional view taken along line of FIG. 7A.

FIGS. 1A through 7A are plan views illustrating a method of manufacturing a semiconductor device according to an embodiment. FIGS. 1B through 7B are cross-sectional views that are respectively taken along lines I-I' of FIGS. 1A through 7A. FIGS. 1C through 7C are cross-sectional views that are respectively taken along lines II-II' of FIGS. 1A through 7A. FIG. 8 is a cross-sectional view taken along line of FIG. 7A.

Figure 1C:
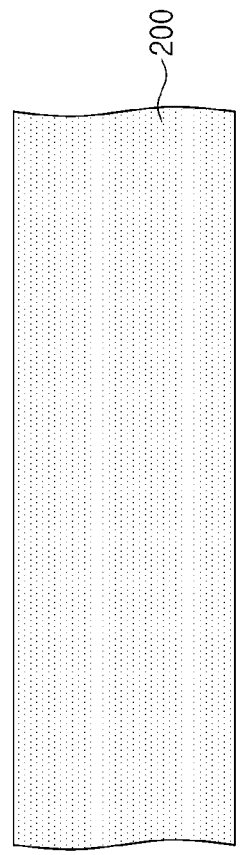

Referring to FIGS. 1A, 1B, and 1C, a semiconductor substrate 200 having first, second, and third regions 190, 193, and 195 is provided. The first region 190 may be a region where a first optical device will be formed. The third region 195 is spaced apart from the first region 190. The third region 195 may be a region where a second optical device will be formed. The second region 193 is between the first and third regions 190 and 195. The second region 193 may be a region where an optical waveguide will be formed. The first, second, and third regions 190, 193, and 195 may be independently disposed from each other. The semiconductor substrate 200 may further include a first complementary metal-oxide semiconductor (CMOS) device region 197 closer to the first region 190 and a second CMOS device region 198 closer to the third region 195. The first and second CMOS device regions 197 and 198 may be independently arranged from each other. Also, the first and second CMOS device regions 197 and 198 may be arranged independent from the first, second, and third regions 190, 193, and 195. The semiconductor substrate 200 may be in a bulk state. The semiconductor substrate 200 may be in a single-crystal state. The semiconductor substrate 200 may be one of a silicon substrate, a germanium substrate, a silicon-germanium substrate, and a compound semiconductor substrate. According to one embodiment, the semiconductor substrate 200 may be a bulk silicon substrate.

As shown in FIG. 1B, a first buried oxide layer 205a may be formed in the semiconductor substrate 200 in the first region 190. The first buried oxide layer 205a may be formed at a predetermined depth from a top surface of the semiconductor substrate 200 in the first region 190. In more detail, a top surface of the first buried oxide layer 205a is spaced apart downward from the top surface of the semiconductor substrate 200. Accordingly, a first semiconductor layer 210a is defined on the top surface of the first buried oxide layer 205a in the first region 190. The first semiconductor layer 210a corresponds to a portion of the semiconductor substrate 200 located on the first buried oxide layer 205a.

A second buried oxide layer 205b may be formed in the semiconductor substrate 200 in the third region 195. The second buried oxide layer 205b may be formed at a predetermined depth from a top surface of the semiconductor substrate 200 in the third region 195. In more detail, a top surface of the second buried oxide layer 205b is spaced apart downward from the top surface of the semiconductor substrate 200. Accordingly, a second semiconductor layer 210b is defined on the top surface of the second buried oxide layer 205b in the third region 195. The second semiconductor layer 210b corresponds to a portion of the semiconductor substrate 200 located on the second buried oxide layer 205b.

The first and second buried oxide layers 205a and 205b may be simultaneously formed. At this point, the second region 193 may maintain a bulk state. That is, the first and second buried oxide layers 205a and 205b may be locally formed in the first and third regions 190 and 195, respectively.

The first and second buried oxide layers 205a and 205b may be formed through a separation by implanted oxygen (SIMOX) process. In more detail, a mask pattern (not shown) having openings may be formed. The openings expose the semiconductor substrate 200 in first and third regions 190 and 195, respectively. Oxygen ions may be implanted to form the first and second buried oxide layers 205a and 205b using the mask pattern as a ion mask. The mask pattern covers the semiconductor substrate 200 in the second region 193. The mask pattern may further include openings exposing the semiconductor substrate 200 in the first and second CMOS device regions 197 and 198. In this case, buried oxide layers (not shown) may be formed in the semiconductor substrate 200 in the first and second CMOS device regions 197 and 198. On the other hand, in one embodiment, the mask pattern may cover the semiconductor substrate in the first and second CMOS device regions 197 and 198. In this case, the semiconductor substrate 200 in the first and second CMOS device regions 197 and 198 may maintain the bulk state. After removing the mask pattern, an annealing process may be preformed for the reaction between the oxygen ions implanted in the semiconductor substrate 200 and the semiconductor atoms.

Figure 2B:
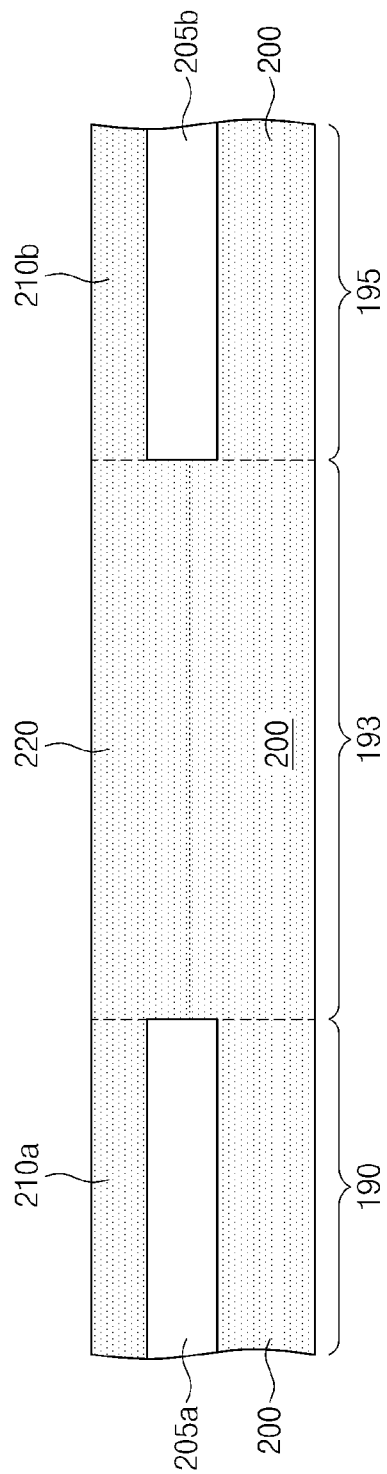
Figure 2C:
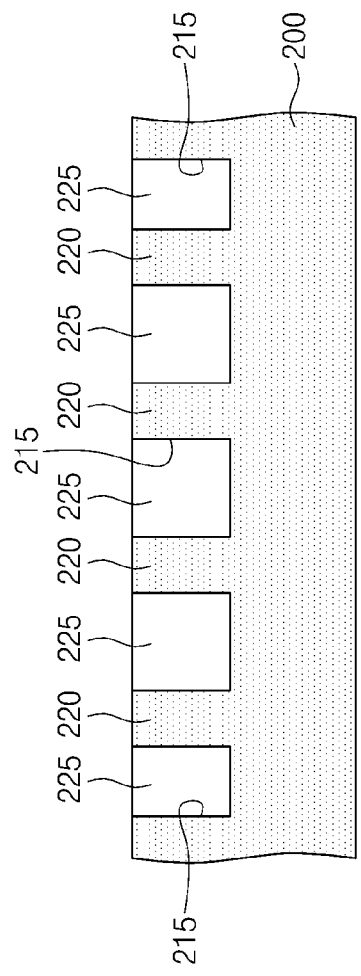

Referring to FIGS. 2A, 2B, and 2C, trenches 215 defining active portions 220 are formed by patterning the semiconductor substrate 200 in the second region 193. A bottom surface of the trenche 215 is lower than the top surface of the semiconductor substrate 200. Each of the active portions 220 may be disposed between the adjacent trenches. The active portions 200 correspond to portions of the semiconductor substrate 200, which are defined by the trenches 215. Accordingly, the top surfaces of the active portions 220 are located at a same level as the top surface of the semiconductor substrate 200. A process for patterning the semiconductor substrate 200 may include a photolithography process defining the trenches 215 and an etching process for etching the semiconductor substrate 200 using a mask pattern (not shown) defined by the photolithography process as an etching mask. The etching process may be performed through a reactive ion etching process and/or an inductively coupled plasma etching process.

Each of the active portions 220 may be formed in a line shape in plan view. According to one embodiment, each of the active portions 220 may include at least one bending portion in plan view. A first end of each of the active portions 220 may be connected to the first semiconductor layer 210a and a second end of each of the active portions 220 may be connected to the second semiconductor layer 210b. In more detail, the first end of each of the active portions 220 may contact the first semiconductor layer 210a and the second end of each of the active portions 220 may contact the second semiconductor layer 210b.

Next, a sacrificing layer filling the trenches 215 is formed on an entire surface of the semiconductor substrate 200. The sacrificing layer is planarized until the top surface of the semiconductor substrate 200 is exposed to form sacrificing patterns 225 filling the respective trenches 215. The sacrificing patterns 225 is formed of a material having an etch selection ratio with respect to the semiconductor substrate 200. For example, the sacrificing patterns 225 may be formed of oxide (e.g., TEOS oxide, etc.), nitride oxide, and/or nitride.

Figure 3A:
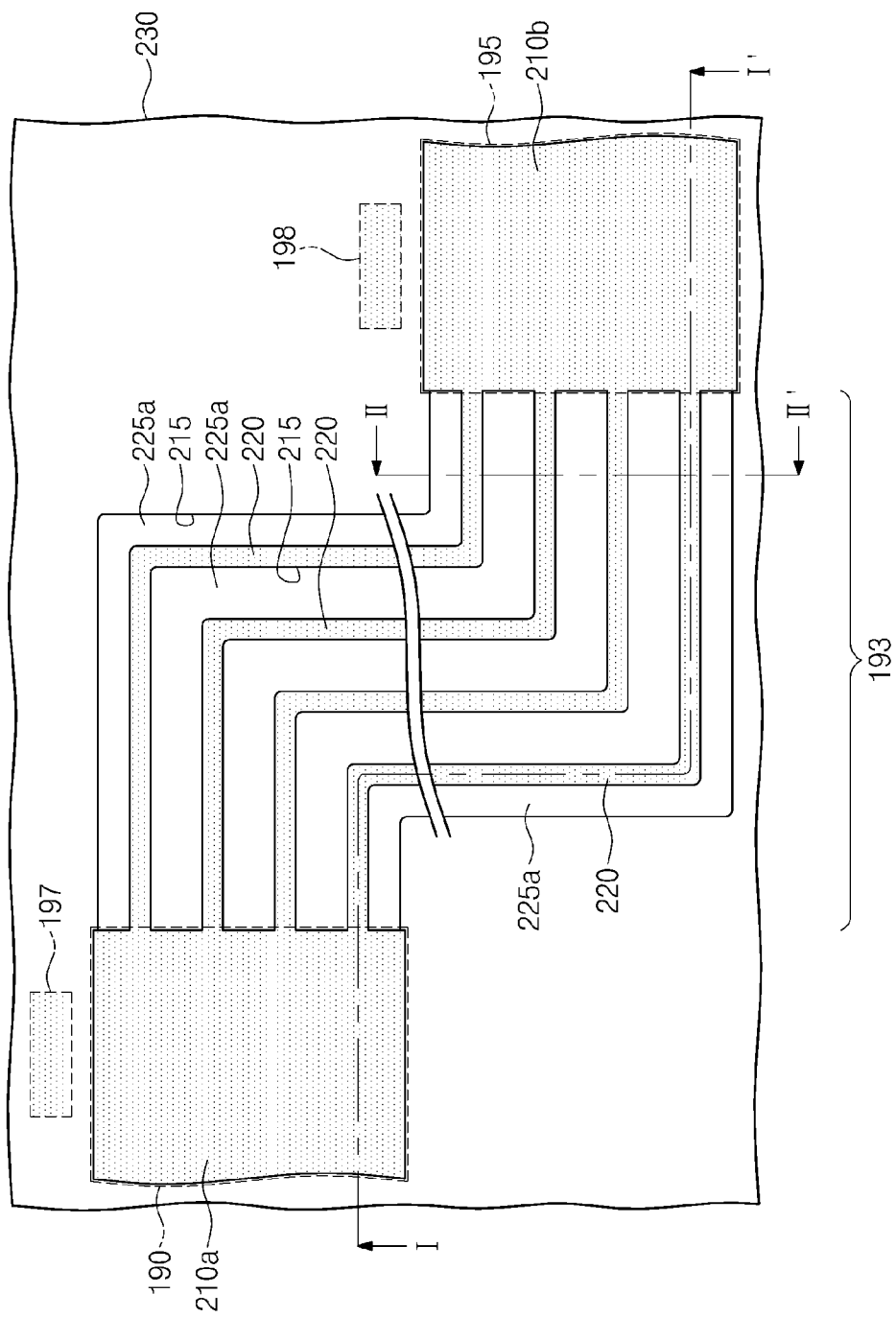
Figure 3B:
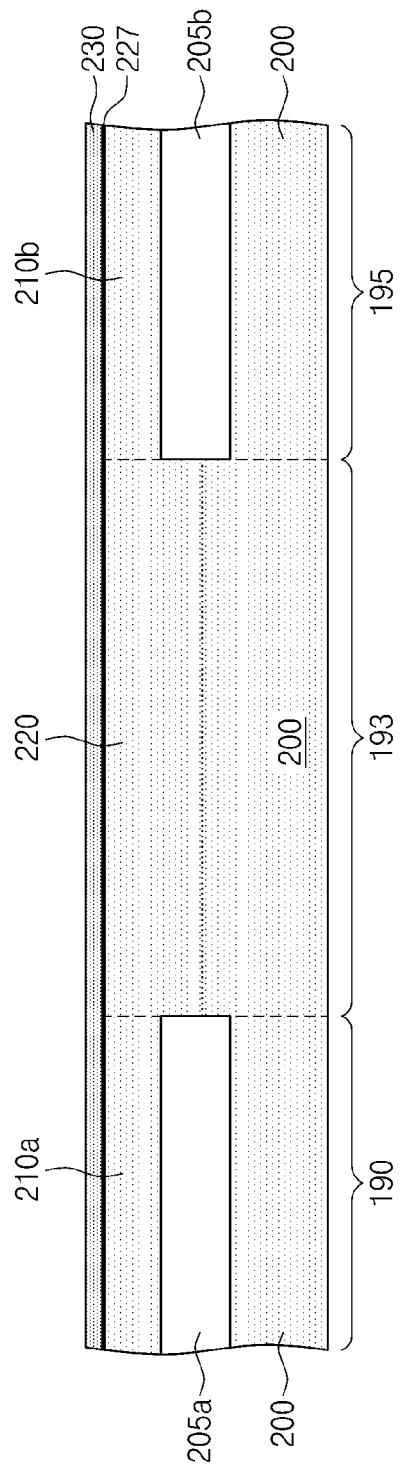
Figure 3C:
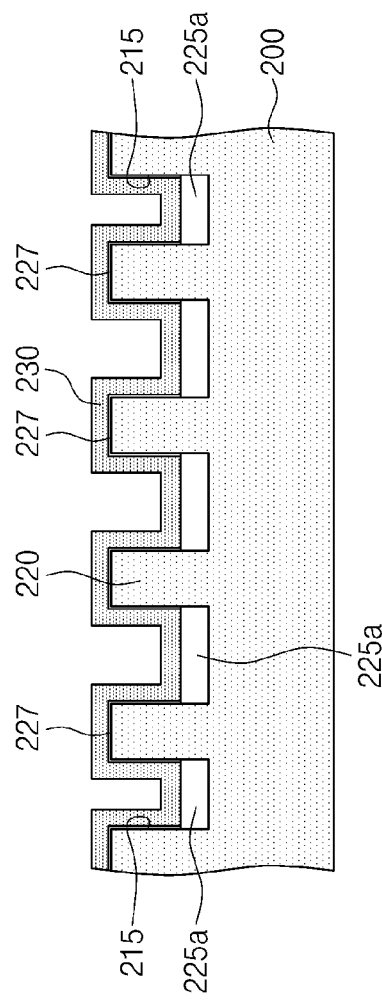

Referring to FIGS. 3A, 3B, and 3C, the sacrificing patterns 225 are recessed to expose an upper portion of a sidewall of each the active portion 220. The top surfaces of the recessed sacrificing patterns 225a are located to be lower than the top surfaces of the active portions 220. Accordingly, the upper portion of the sidewall of each the active portion 220 is exposed. A lower portion of the sidewall of each the active portion 220 is covered by the recessed sacrificing pattern.

Next, a buffer layer 227 may be formed on the exposed top surfaces of the active portions 220 and the exposed upper portions of the sidewalls of the active portions 220. The buffer layer 227 may be an oxide layer. For example, the buffer layer 227 may be formed through a thermal oxidizing process, a radical oxidizing process, and a thermal/radical oxidizing process, and/or the like. The radical oxidizing process is an oxidizing process using oxygen molecules in a radical state or oxygen atoms in a radical state. The thermal/radical oxidizing process is an oxidizing process using thermal energy as well as oxygen atoms (or molecules) in a radical. The buffer layer 227 may be also formed on top surfaces of the first and second semiconductor layers 210a and 210b. According to one embodiment, the process for forming the buffer layer 227 may be omitted.

Next, a capping semiconductor layer 230 is formed on an entire surface of the semiconductor substrate 200. The capping semiconductor layer may be formed to be conformal. Accordingly, the capping semiconductor layer 230 is formed to have a substantially uniform thickness along the upper portions of sidewalls and top surfaces of the active portions 220 and the top surfaces of the recessed sacrificing patterns 225a. The capping semiconductor layer 230 may be formed on the buffer layer 227. On the other hand, when the buffer layer 227 is omitted, the capping semiconductor layer 230 may contact the top surfaces and upper portion of the sidewalls of the active portions 220. After forming the capping semiconductor layer 230, the trenches 215 on the recessed sacrificing patterns 225a may be partially emptied.

The capping semiconductor layer 230 may be formed of a same semiconductor material as the semiconductor substrate 200. For example, when the semiconductor substrate 200 is a silicon substrate, the capping semiconductor layer 230 may be formed of silicon. The capping semiconductor layer 230 may be in a polycrystal state. The capping semiconductor layer 230 may be formed through a chemical vapor deposition process and/or a atomic layer deposition process.

Figure 4A:
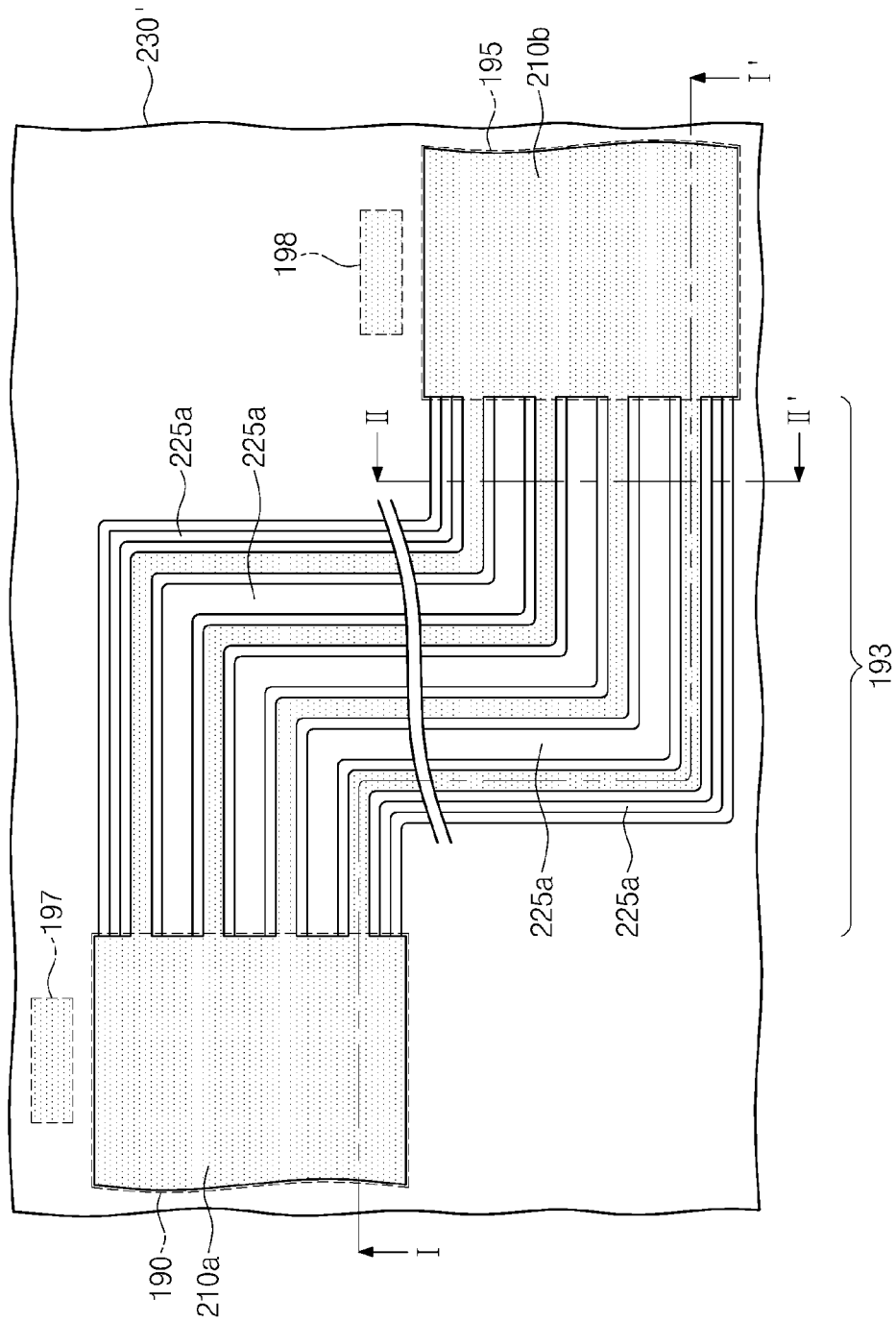
Figure 4B:
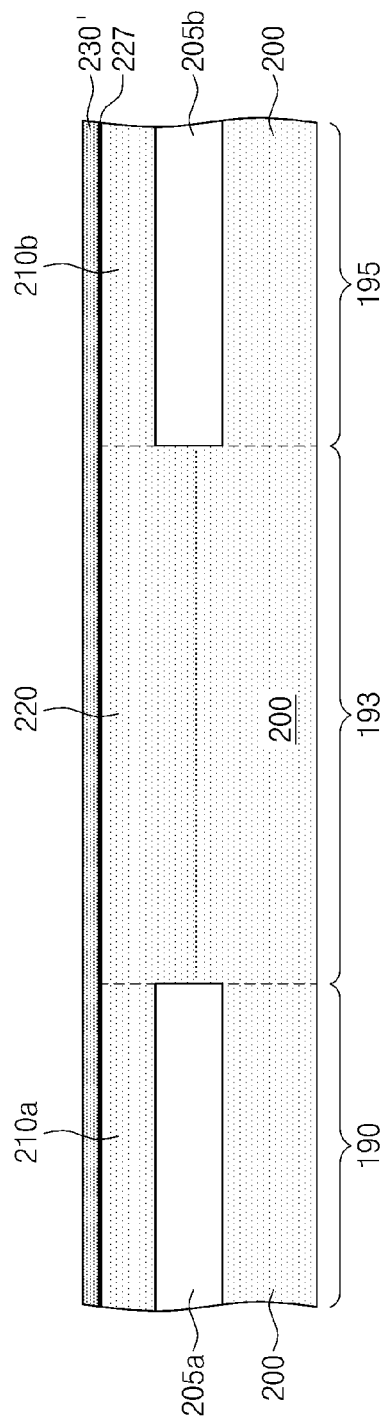
Figure 4C:
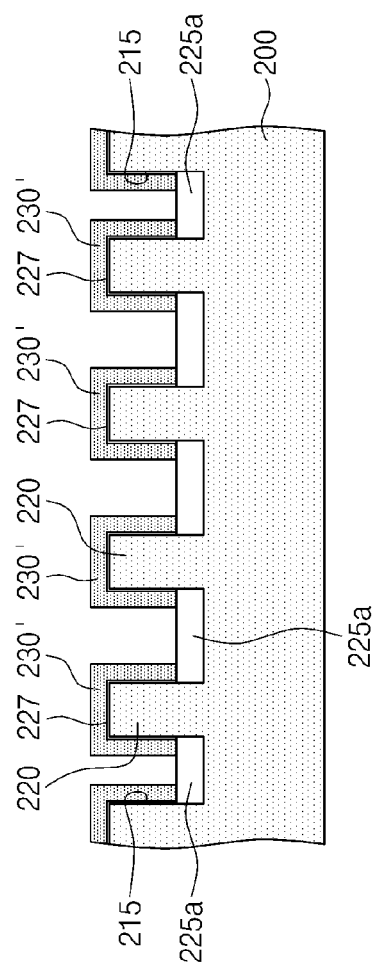

Referring to FIGS. 4A, 4B, and 4C, portions of the capping semiconductor layer 230 located on top surfaces of the recessed sacrificing patterns 225a are selectively removed to expose the recessed sacrificing patterns 225a, thereby forming capping semiconductor pattern 230'. The capping semiconductor pattern 230' covers the top surfaces of the active portions 220 and the upper portions of the sidewalls of the active portions 220. The capping semiconductor pattern 230' may extend to be formed on the first and second semiconductor layers 210a and 210b. When the buffer layer 227 is omitted, the capping semiconductor pattern 230' on the first and second semiconductor layers 210a and 210b may contact the first and second semiconductor layers 210a and 210b.

The removal of the portions of the capping semiconductor layer 230 on the recessed sacrificing patterns 225a may be realized by a patterning process including the photolithography process and the etching process. In this case, a mask pattern (not shown) covers the capping semiconductor layer 230 on the top surfaces of the active portions 220. Furthermore, the mask pattern may cover the capping semiconductor layer 230 on the first and second semiconductor layers 210a and 210b. At this point, portions of the capping semiconductor layer 230 on the top surfaces of the recessed sacrificing patterns 225a are exposed.

Figure 5A:
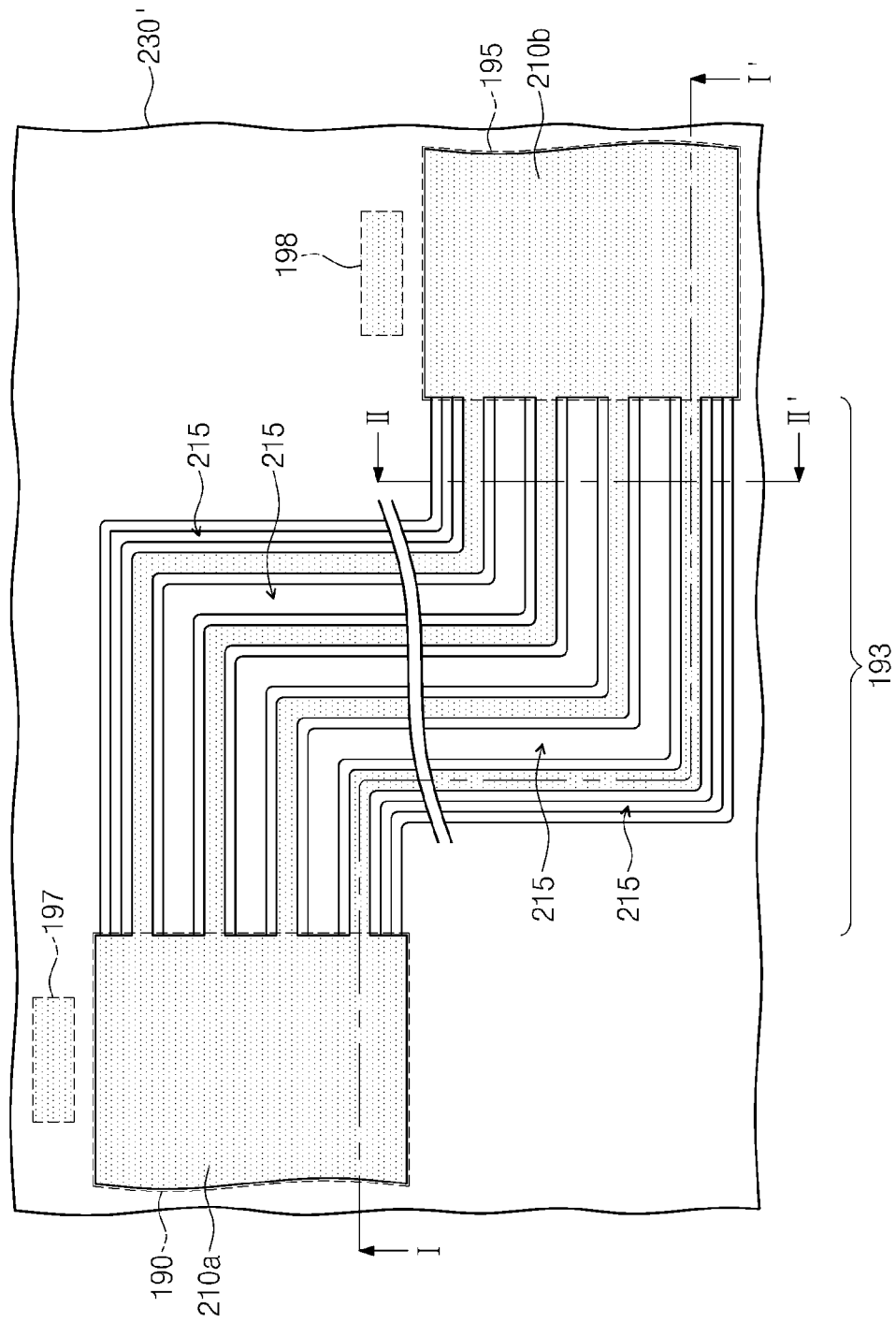

Referring to FIGS. 5A, 5B, and 5C, the exposed recessed sacrificing patterns 225a are removed to expose the lower portions of the sidewalls of the active portions 220. Due to removing the recessed sacrificing patterns 225a, the bottom surfaces of the trenches 215 are exposed. The exposed recessed sacrificing patterns 225a may be removed through an isotropic etching process. The exposed recessed sacrificing patterns 225a may be removed through a wet-etching process, an isotropic dry-etching process, and/or the like.

As described above, by removing the recessed sacrificing patterns 225a, the lower portions of the sidewalls of the active portions 220 are exposed. At this point, the capping semiconductor pattern 230' still covers the top surfaces of the active portions 220 and the upper portions of sidewalls of the active portions 220.

Referring to FIGS. 6A, 6B, and 6C, next, an oxidizing process is performed to the semiconductor substrate 200. Accordingly, the active portion 220 is partially oxidized to form an oxide layer 240. In more detail, the lower portion of the active portion 220 is oxidized through the exposed lower portion of the sidewall of the active portion 220. Further, the capping semiconductor patterns 230' are oxidized through the oxidizing process. Especially, the capping semiconductor patterns 230' may be fully oxidized. At this point, a portion of the active portion 220 is in a non-oxidized state. The non-oxidized portion of the active portion 220 functions as a core 220a. Optical signals pass through the core 220a. That is, the core 220a is included in an optical waveguide. A first end of the core 220a may be connected to the first semiconductor layer 210a, and a second end of the core 220a may be connected to the second semiconductor pattern 210b.

The oxide layer 240 includes a first portion 235 formed by oxidizing the capping semiconductor pattern 230' and a second portion 237 formed by oxidizing the lower portion of the active portion 220. When the buffer layer 227 is formed, the oxide layer 240 may further include the buffer layer 227. A thickness scale of the buffer layer 227 is greatly smaller than that of the oxide layer 240. Therefore, the buffer layer 227 was omitted in FIGS. 6B and 6C. However, as previously described, the oxide layer 240 may include the buffer layer 227. The oxide layer 240 may correspond to a cladding of the optical waveguide surrounding the core 220a. For example, the semiconductor substrate 200 may be a bulk silicon substrate, the capping semiconductor pattern 230' may be formed of polysilicon, and the oxide layer 240 may be a silicon oxide layer.

The lower portion of the active portion 220 may be fully oxidized by the oxidizing process. At this point, a thickness of the capping semiconductor pattern 230' may be equal to or less than ½ of the width of the active portion 220. Accordingly, the capping semiconductor pattern 230' can be fully oxidized by the oxidizing process.

When the buffer layer 227 is formed, the buffer layer 227 can suppress the oxidizing of the upper portion of the active portion 220. On the other hand, when the buffer layer 227 is omitted, a portion (e.g., a surface portion) of the upper portion of the active portion 220 may be oxidized. However, in this case, the active portion 220 includes a non-oxidized portion.

The capping semiconductor pattern 230' on the first and second semiconductor layers 210a and 210b may be also fully oxidized. Therefore, the oxide layer 240 is also formed on the first and second semiconductor layers 210a and 210b.

Referring to FIGS. 7A, 7B, 7C, and 8, portions of the oxide layer 240 on the first and second semiconductor layers 210a and 210b may be removed. According to one embodiment, as shown in FIGS. 7B and 7C, the oxide layer 240 may be planarized until the top surfaces of the cores 220a and the top surfaces of the first and second semiconductor layers 210a and 210b are exposed.

First optical devices 250 and 350 are formed at the first semiconductor layer 210a. Second optical devices 255 and 355 are formed at the second semiconductor layer 210b. The first optical devices 250 and 350 are connected to first ends of the cores 220a, respectively, and the second optical devices 255 and 355 are connected to second ends of the cores 220a, respectively.

The first optical devices 250 and 350 may include an optical modulator type optical device and/or an optical transceiver type optical device. In FIG. 7A, the reference number "250" may represent the optical modulator type first optical device 250 and the reference number "350" may represent the optical transceiver type first optical device 350. Likewise, the second optical devices 255 and 355 may include an optical modulator type optical device and/or an optical transceiver type optical device. In FIG. 7A, the reference number "355" may represent the optical modulator type second optical device 355 and the reference number "255" may be the optical transceiver type second optical device 255. One of the first optical device 250 or 350 and the second optical device 255 or 355 connected to the first end and the second of each the core 220a may be the optical modulator type optical device and the other may be the optical transceiver type optical device.

Referring to FIGS. 7A, 7B, and 8, the optical modulator type first optical device 250 may includes an optical modulating portion 251 and a pair of electrodes 252 disposed at opposite sides of the optical modulating portion 251. The optical modulating portion 251 and the electrodes 252 may be formed of a semiconductor material. For example, the optical modulating portion 251 and the electrodes 252 may be formed of a same semiconductor material as the first semiconductor layer 210a. Optical signals pass through the optical modulating portion 251. That is, the optical modulating portion 251 functions as a passageway through which the optical signals are transmitted. Top surfaces of the electrodes 252 may be lower than the top surface of the optical modulating portion 251. A pair of doped regions 253 may be formed in the pair of the electrodes 252, respectively. A concentration of the carriers in the optical modulating portion 251 may be changed in accordance with an operating voltage from the doped regions 253. Accordingly, the optical signals passing through the optical modulating portion 251 can be modulated. The optical modulating portion 251 may be in an intrinsic state. The optical modulating portion 251 may be connected to the first end of the core 220a.

Referring to FIGS. 7A and 7B, the optical transceiver type second optical device 255 may include a transceiver-core 256 formed of a semiconductor material, a grating coupler 257 on a top surface of the transceiver-core 256, and an optical transceiver unit 258 above an upper portion of the grating coupler 257. The transceiver-core 256 may be connected to the second end of the core 220a. The optical signals generated by the optical transceiver unit 258 may be transferred into the transceiver-core 256 through the grating coupler 257 and may be further transferred to the optical modulator type first optical device 250 through the core 220a. The optical signals transferred to the first optical device 250 may be modulated.

The optical transceiver type first optical device 350 may be identically structure to the optical transceiver type second optical device 255. Likewise, the optical modulator type second optical device 355 may be also identically structured as the optical modulator type first optical device 250.

However, the present invention is not limited to the above. The first optical devices 250 and 350 may include different type and/or different function of optical devices (e.g., a ring resonator, a MachZehnder modulator, and/or a different type of optical transceiver optical device). In addition, the second optical devices 255 and 355 may also include different type and/or different function of optical devices (e.g., a ring resonator, a MachZehnder modulator, and/or a different type of optical transceiver optical device).

Referring to FIG. 7A, a first CMOS device for controlling the first optical devices 250 and 250 may be formed in the first CMOS device region 197. Likewise, a second CMOS device for controlling the second optical devices 255 and 355 may be formed in the second CMOS device region 198. The first and second CMOS devices may be formed after the core 220a is formed. According to one embodiment, the first and second CMOS devices may be formed after or before the first and second optical devices 250, 250, 255, and 355 are formed.

According to the above-described semiconductor device manufacturing method, the cores 220a and the oxide layer 240 are formed by forming the trenches 215 in the bulk-state semiconductor substrate 200 in the second region 193 and performing the oxidizing process. Accordingly, a boundary surface between the oxide layer 240 and the cores 220a can maintain an excellent state. Further, the optical devices 250, 350, 255 and 355 connected to the opposite ends of the cores 220a are formed at the first and second buried oxide layers 205a and 205b that are locally formed in the semiconductor substrate 200. Accordingly, an optical waveguide having an excellent property and optical devices having an excellent property can be realized using an inexpensive bulk semiconductor substrate.

According to one embodiment, as described above, after forming the first and second buried oxide layers 205a and 205b, the cores 220a and oxide layer 240 may be formed and the optical devices 250, 350, 255, and 355 may be formed. Alternatively, after the cores 220a and oxide layer 240 are formed, the first and second buried oxide layers 205a and 205b may be formed and then the optical devices 250, 350, 255, and 355 may be formed.

Meanwhile, as shown in FIGS. 7A, 7B, and 7C, the oxide layer 240 on the cores 220a may be removed. Alternatively, the oxide layer 240 may be leaved on the cores 220a. This will be described with reference to the drawings.

FIGS. 9A and 9B are respectively views taken along lines I-I' and II-II' of FIG. 7A, illustrating modified examples of the method for manufacturing the semiconductor device.

Referring to FIGS. 9A and 9B, after the oxide layer 240 of FIGS. 6B and 6C are formed, the oxide layer 240 on the first and second semiconductor layers 210a and 210b may be selectively removed. For example, a mask pattern covering the oxide layer 240 in the second region 193 may be formed. In this time, the oxide layer 240 on the first and second semiconductor layers 210a and 210b may be exposed. And then the oxide layer 240 on the first and second semiconductor layers 210a and 210b may be removed using the mask pattern as an etching mask. At this point, as shown in FIGS. 9A and 9B, the oxide layer 240 in the second region 193 is leaved by the mask pattern.

Next, the first optical devices may be formed on the first semiconductor layer 210a and the second optical devices may be formed on the second semiconductor layer 210b.

According to the above-described semiconductor device manufacturing method, the cores may be surrounded by the oxide layer that is formed by the oxidizing process after the trenches are formed in the semiconductor substrate in the second region. Accordingly, the boundary surface between the oxide layer and the cores is maintained in an excellent state and thus a reliable optical waveguide can be realized. Further, the first optical device connected to the first end of the core is formed on the first buried oxide layer that is locally formed in the semiconductor substrate. Accordingly, the reliabilities of the first optical device and optical waveguide can be improved.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a semiconductor device, comprising:

providing a semiconductor substrate having a first region where a first optical device is to be formed and a second region where a waveguide is to be formed;

forming a first buried oxide layer in the semiconductor substrate in the first region so that the semiconductor substrate in the first region is divided into a lower semiconductor layer and an upper semiconductor layer, while not forming the first buried oxide layer in the semiconductor substrate in the second region;

defining an active portion by forming a trench in the semiconductor substrate in the second region;

forming a capping semiconductor pattern over a top surface of the active portion and over a sidewall of the active portion;

exposing a lower portion of the sidewall of the active portion;

oxidizing the capping semiconductor pattern and the lower portion of the sidewall of the active portion to form an oxide layer surrounding a non-oxidized portion of the active portion; and forming a first optical device disposed in the upper semiconductor layer of the first region, wherein the non-oxidized portion of the active portion is configured to be a core of the waveguide through which optical signals pass, wherein the core is coupled to the first optical device, and wherein the forming of the capping semiconductor pattern comprises:

forming a sacrificing pattern filling the trench;

exposing an upper portion of the sidewall of the active portion by recessing the sacrificing pattern;

conformally forming a capping semiconductor layer over the semiconductor substrate;

removing the capping semiconductor layer over the recessed sacrificing pattern to expose the recessed sacrificing pattern and to form the capping semiconductor pattern; and removing the exposed sacrificing pattern to expose the lower portion of the sidewall of the active portion, wherein the capping semiconductor pattern extends to cover a top surface of the upper semiconductor layer in the first region, and wherein a portion of the capping semiconductor pattern over the upper semiconductor layer is oxidized by an oxidizing process, so that the oxide layer is formed over the upper semiconductor layer.

2. The method of claim 1, the method further comprising: before forming the first optical device, removing the oxide layer over the upper semiconductor layer.

3. The method of claim 2, wherein the removing of the oxide layer over the upper semiconductor layer comprises planarizing the oxide layer until the upper semiconductor layer and a top surface of the core are exposed.

* * * * *